(12) United States Patent
Chung et al.

(10) Patent No.: US 10,421,855 B2
(45) Date of Patent: Sep. 24, 2019

(54) FLUORINATED VINYL POLYMER RESIN COMPOSITION, PREPREG AND LAMINATE MATERIALS CONTAINING THE SAME

(71) Applicant: VENTEC ELECTRONICS (SUZHOU) CO., LTD., Suzhou Jiangsu (CN)

(72) Inventors: Chien-Jen Chung, Jiangsu (CN); Zhuo Wang, Suzhou Jiangsu (CN); Shuiping Zou, Suzhou Jiangsu (CN); Jin Qian, Suzhou Jiangsu (CN)

(73) Assignee: VENTEC ELECTRONICS (SUZHOU) CO., LTD., Suzhou (CN)

( * ) Notice: Subject to any disclaimer, the term of this patent is extended or adjusted under 35 U.S.C. 154(b) by 100 days.

(21) Appl. No.: 15/418,644

(22) Filed: Jan. 27, 2017

(65) Prior Publication Data

US 2018/0201809 A1    Jul. 19, 2018

(30) Foreign Application Priority Data

Jan. 18, 2017 (CN) .......................... 2017 1 0036777

(51) Int. Cl.

| C08J 7/02 | (2006.01) |
|---|---|
| C08J 5/24 | (2006.01) |
| C08L 71/12 | (2006.01) |
| C08L 87/00 | (2006.01) |
| C08L 27/16 | (2006.01) |
| C08L 27/12 | (2006.01) |
| H05K 1/03 | (2006.01) |
| C09J 7/29 | (2018.01) |
| H05K 1/02 | (2006.01) |

(52) U.S. Cl.
CPC .................. *C08L 27/12* (2013.01); *C08J 5/24* (2013.01); *C08L 71/123* (2013.01); *C08L 87/00* (2013.01); *C09J 7/29* (2018.01); *H05K 1/0366* (2013.01); *C08J 2327/12* (2013.01); *C08J 2327/16* (2013.01); *C08J 2371/12* (2013.01); *C08J 2409/00* (2013.01); *C08J 2427/12* (2013.01); *C08J 2471/12* (2013.01); *C08J 2479/04* (2013.01); *C08L 2201/02* (2013.01); *C08L 2203/20* (2013.01); *C09J 2203/326* (2013.01); *C09J 2400/163* (2013.01); *C09J 2423/00* (2013.01); *C09J 2427/00* (2013.01); *C09J 2471/00* (2013.01); *H05K 1/024* (2013.01); *H05K 1/0373* (2013.01); *H05K 2201/012* (2013.01); *H05K 2201/015* (2013.01)

(58) Field of Classification Search
CPC ................ C09J 7/0296; C09J 2203/326; C09J 2400/163; C09J 2427/00; C09J 2471/00; C09J 2423/00; C08J 5/24; C08J 2400/106; C08J 2471/12; C08J 2327/12; C08J 2409/00; C08J 2327/16; C08J 2427/18; C08L 71/123; C08L 87/00; C08L 27/16; C08L 27/12
See application file for complete search history.

(56) References Cited

U.S. PATENT DOCUMENTS

| 2,539,329 A | 1/1951 | Du Pont |
| 2013/0095329 A1* | 4/2013 | Lim .......................... B32B 7/10 |
| | | 428/422 |

FOREIGN PATENT DOCUMENTS

| CN | 102711378 | 10/2012 |
| CN | 103547074 | 1/2014 |
| JP | 2004-10823 | * 1/2004 |

* cited by examiner

*Primary Examiner* — Robert D Harlan
(74) *Attorney, Agent, or Firm* — Gokalp Bayramoglu

(57) ABSTRACT

Disclosed are fluorinated vinyl polymer resin compositions, and prepregs and laminate materials containing the same. The fluorinated vinyl polymer resin composition includes a fluorine-substituted vinyl polymer resin and a functional polymer, where the fluorine-substituted vinyl polymer resin has the chemical structure:

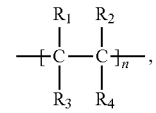

where the maximum particle size is less than about 100 microns, at least one of the substituents $R_1$, $R_2$, $R_3$, and $R_4$ includes a fluorine atom, and where n is greater than about 100. The fluorinated vinyl polymer resin composition can be incorporated in prepreg and laminate materials.

2 Claims, No Drawings

FLUORINATED VINYL POLYMER RESIN COMPOSITION, PREPREG AND LAMINATE MATERIALS CONTAINING THE SAME

TECHNICAL FIELD

This disclosure generally relates to fluorinated vinyl polymer resin compositions, and prepreg and laminate materials containing the same, and electronic products that can be manufactured therefrom.

BACKGROUND

With the development of wireless network and satellite communications, electronic products are trending toward the need for higher speed, frequency and larger capacity for the transmission of voice, video and data. In addition, as these electronic products become thinner and smaller, electrical circuit boards tend to increase in complexity, density and multi-layer stratification.

In order to maintain the high rate of transmission and signal integrity, printed circuit board (PCB) have a need for materials with low dielectric constant ($D_k$) and low dielectric loss (sometimes also called loss factor or dissipation factor, $D_f$) thereby resulting in lower signal loss.

The current use of polyphenylene oxide, cyanate ester glue or modified epoxy glue in making prepregs are only able to produce laminates with glue content of 50-60% and $D_k$ values of not less than 3.2. As such, these materials are unable to meet the high speed and signal transmission requirements. Chinese Patent Application Nos. 201210144675.4 and 201310476142.0 disclose mixing polytetrafluoroethylene (PTFE) powder and polyphenylene ether powder, and ball milling the same in a mixer cavity at 285° C. and compression molded to form a dielectric material layer. Fiberglass cloth material can be impregnated and sintered with PTFE resin to produce a prepreg, and bonded with copper foil, metal substrate, the compression molded dielectric material layer, and the prepreg in that order to form a multi-layer laminate material. The techniques disclosed in these applications are complex, cost prohibitive, and have difficulties associated with controlling the thickness and uniformity of the resulting multi-layer laminate material. Additionally, the appearance of the multi-layer laminate material is not smooth and therefore difficult to incorporate into PCB's that have multiple layers.

U.S. Pat. No. 2,539,329 discloses the use of pre-treating PTFE coated fiberglass at 205° C., followed by rolling and impregnating to improve the "mud cracks" of the PTFE coating. This method has the challenge in that the original coating layer can peel when it is re-dipped, and that it is difficult to laminate at temperatures below 250° C.

SUMMARY

An object of the present disclosure is to overcome the challenges of the prior art, and to provide a fluorinated vinyl polymer resin composition, and prepreg and laminate materials containing the same. The method of preparing the composition is simple, and the composition can be applied to various electronic components to greatly improve the signal transmission speed and reduce signal loss. The resulting prepreg can exhibit uniform adhesive properties, smooth surface and stable performance, and the manufacturing process of the laminate material is simple resulting in excellent mechanical and electrical properties, dielectric properties, as well as being heat resistant.

To achieve the above technical objectives, disclosed are fluorinated vinyl polymer resin compositions, and prepreg and laminate materials containing the same. In one embodiment, a fluorinated vinyl polymer resin composition includes a fluorine-substituted vinyl polymer resin and a functional polymer. In this embodiment, the fluorine-substituted vinyl polymer resin has the chemical structure:

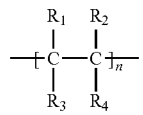

In one embodiment, the maximum particle size of the resin can be less than about 100 microns, at least one of the substituents $R_1$, $R_2$, $R_3$, and $R_4$ includes a fluorine atom, and n can be greater than about 100.

In one embodiment, the functional polymer can be selected from the group consisting of epoxy resin, polyphenol ether, cyanate ester resin, polyphenylene ether resin, polybutadiene, polyisoprene, modified epoxy resin, modified polyphenol ether, modified cyanate ester resin, modified polyphenylene ether resin, modified polybutadiene, modified polyisoprene, and mixtures thereof. In another embodiment, the fluorine-substituted vinyl polymer resin is selected from the group consisting of polyvinyl fluoride, polyfluoroethylene, tetrafluoroethylene, polytetrafluoroethylene (PTFE), polyvinylidene fluoride, polytrifluoroethylene, and mixtures thereof. In yet another embodiment, the mass fraction of the resin can be in the range of from about 1% to about 70%.

In one embodiment, the composition can further include a filler with a solid mass percentage of less than about 80%, where the filler can be organic or inorganic. In some embodiments, the filler can be optionally surface treated with a coupling agent. In one embodiment, the composition can further include a crosslinking agent. In some embodiments, the crosslinking agent can be selected from the group consisting of amines, acid anhydrides, phenols, active esters, peroxides, and mixtures thereof. In one embodiment, the composition can further include a flame-retardant material. In some embodiments, the composition can further include one or more solvents selected from the group consisting of acetone, butanone, cyclohexanone, N,N-dimethylformamide, N,N-dimethylacetamide, benzene, toluene, xylene, water, and mixtures thereof.

In some embodiments, the glass transition temperature of the composition can be greater than about 170° C. In other embodiments, the decomposition temperature of the composition can be greater than about 350° C. In some embodiments, the delamination time of the composition at 288° C. can be greater than about 30 minutes. In other embodiments, the dielectric constant of the composition can be in the range of from about 2.4 to about 2.8. In yet other embodiments, the dielectric loss of the composition can be in the range of from about 0.001 to about 0.01.

In one embodiment, a prepreg includes a substrate that can be formed by impregnating the substrate with a fluorinated vinyl polymer resin composition. In this embodiment, the fluorinated vinyl polymer resin composition includes a fluorine-substituted vinyl polymer resin and a functional polymer, where the fluorine-substituted vinyl polymer resin has the chemical structure:

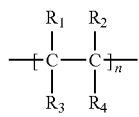

In one embodiment, the maximum particle size of the resin can be less than about 100 microns, at least one of the substituents $R_1$, $R_2$, $R_3$, and $R_4$ includes a fluorine atom, and n is greater than about 100. In another embodiment, the substrate can be impregnated by partially curing the resin composition.

In some embodiments, the substrate of the prepreg can be glass fiber, composite, fiberglass fabric or cloth, and mixtures thereof, and where the functional polymer can be selected from the group consisting of epoxy resin, polyphenol ether, cyanate ester resin, polyphenylene ether resin, polybutadiene, polyisoprene, modified epoxy resin, modified polyphenol ether, modified cyanate ester resin, modified polyphenylene ether resin, modified polybutadiene, modified polyisoprene, and mixtures thereof. In other embodiments, the dielectric constant of the composition can be in the range of from about 2.4 to about 2.8.

In one embodiment, a laminate includes a copper foil hot pressed to a prepreg, where the prepreg includes a substrate formed by impregnating the substrate with a fluorinated vinyl polymer composition. In this embodiment, the fluorinated vinyl polymer composition includes fluorine-substituted vinyl polymer resin and a functional polymer, where the fluorine-substituted vinyl polymer resin has the chemical structure:

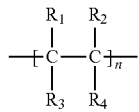

In one embodiment, the maximum particle size of the resin of the composition can be less than about 100 microns, at least one of the substituents $R_1$, $R_2$, $R_3$, and $R_4$ includes a fluorine atom, and n can be greater than about 100. In another embodiment, the substrate can be impregnated by partially curing the resin.

In some embodiments, the functional polymer can be selected from the group consisting of epoxy resin, polyphenol ether, cyanate ester resin, polyphenylene ether resin, polybutadiene, polyisoprene, modified epoxy resin, modified polyphenol ether, modified cyanate ester resin, modified polyphenylene ether resin, modified polybutadiene, modified polyisoprene, and mixtures thereof, and the dielectric constant of the composition can be in the range of from about 2.4 to about 2.8.

The advantages of the present disclosure include, without limitation, the ease of preparing the fluorine-substituted vinyl polymer resin composition for incorporating into electronic components for improving signal transmission speed and reducing signal loss. A prepreg formed by impregnating a fiberglass cloth substrate with the fluorine-substituted vinyl polymer resin composition can exhibit uniform adhesive properties, and the resulting laminate material can produce glue content of between about 50% and about 60% and $D_k$ values of less than about 3.0. In addition, the laminate material incorporating the fluorine-substituted vinyl polymer resin composition can exhibit high glass transition temperature, high peel-resistance mechanical properties, and excellent dielectric properties, the resulting laminate material being suitable for electronic components used in wireless communication between servers, base stations, antennas and radars, among other electronic devices requiring materials with high reliability and low dielectric and signal losses.

These and other advantages of the present disclosure will become apparent to those skilled in the art from the following detailed description and the appended claims.

DETAILED DESCRIPTION

Example embodiments will now be described hereinafter with reference to the accompanying drawings, which form a part hereof, and which illustrate example embodiments which may be practiced. As used in the disclosures and the appended claims, the terms "embodiment", "example embodiment", and "exemplary embodiment" do not necessarily refer to a single embodiment, although they may, and various example embodiments may be readily combined and interchanged, without departing from the scope or spirit of example embodiments. Furthermore, the terminology as used herein is for the purpose of describing example embodiments only and is not intended to be limitations. In this respect, as used herein, the term "in" may include "in" and "on", and the terms "a," "an" and "the" may include singular and plural references. Furthermore, as used herein, the term "by" may also mean "from", depending on the context. Furthermore, as used herein, the term "if" may also mean "when" or "upon," depending on the context. Furthermore, as used herein, the words "and/or" may refer to and encompass any and all possible combinations of one or more of the associated listed items.

Disclosed materials can be used in electronic devices to facilitate high speed of communication with reduced signal loss. In one embodiment, the material includes a fluorine-substituted vinyl polymer resin. In another embodiment, the fluorine-substituted vinyl polymer resin can be formed into a composition or compound that can be modulated. In some embodiments, the composition or compound can be impregnated into a substrate to produce a prepreg. In some embodiments, the substrate can include glass fiber, composite, fiberglass fabric or cloth, or mixtures thereof. In some embodiments, the substrate can be electronics grade and the fiberglass fabric or cloth, or mixtures thereof, and may or may not be woven. As disclosed herein, the process of forming the substrate can be carried out without sintering or having to force a hot melt against the interior of the mold. The resulting resin composition can be more uniform, the surface can be smooth, and the resulting performance of the prepreg incorporating the resin composition can be more stable and consistent. The disclosed embodiments, therefore, solve many of the problems that exist with current materials and methods of manufacturing the same.

In an embodiment, the prepreg, having the substrate impregnated with the resin, can be hot pressed to a copper foil to form a laminate. The process of producing the laminate, substantially similar to that discussed above, continues to provide the solution of producing materials capable of facilitating high rate of communication with minimal signal loss. In addition, the resulting laminate is able to demonstrate enhanced mechanical properties such as improved heat resistance and enhanced dielectric properties. These improvements, disclosed herein, not only increases the design freedom by allowing the size of the trace features on a printed circuit board (PCB) to be modified, it also creates the opportunity of allowing thinner PCB's to be produced and reducing the overall thickness of PCB's by minimizing the thickness of the layers in between. In some embodiments, the laminate containing the fluorine-substituted vinyl polymer resin composition, can also demonstrate high glass transition temperature, high peeling resistance and mechanical performance, as well as enhanced dielectric properties. In short, the laminate is able to meet the requirements of high reliability and low loss within electronic products for use in servers, base stations, antennas, radar system, and other telecommunication devices.

In one embodiment, a fluorinated vinyl polymer composition includes a fluorine-substituted vinyl polymer resin and a functional polymer, where the fluorine-substituted vinyl polymer resin has a chemical structure of formula (I).

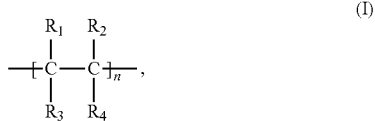

In some embodiments, the maximum particle size of the fluorine-substituted vinyl polymer resin can be less than about 100 microns, or less than about 90 microns, or less than about 80 microns, or less than about 70 microns, or less than about 60 microns, or less than about 50 microns.

In some embodiments, each of $R_1$, $R_2$, $R_3$, and $R_4$ can be independently selected and at least one of the substituents $R_1$, $R_2$, $R_3$, and $R_4$ includes a fluorine atom. In other words, each of the $R_1$, $R_2$, $R_3$, and $R_4$ need not be the same and can have different chemical structures. For example, $R_1$ can be a fluorine-containing compound while each of $R_2$, $R_3$, and $R_4$ need not include any fluorine atoms or compounds. In other embodiments, the fluorine-substituted vinyl polymer resin is selected from the group consisting of polyvinyl fluoride, polyvinyl fluoride, polyfluoroethylene, tetrafluoroethylene, polytetrafluoroethylene (PTFE), polyvinylidene fluoride, polytrifluoroethylene, and mixtures thereof. In a preferred embodiment, substituents $R_1$ and $R_3$ are hydrogen atoms and substituents $R_2$ and $R_4$ are fluorine atoms rendering polyvinyl fluoride as the preferred fluorine-substituted vinyl polymer. Specifically, polyvinyl fluoride is preferred because its chemical structure is not symmetrical thereby enhancing its polarity thus making it more conducive to resin compatibility and dispersion.

In some embodiments, the repeating unit number n can be greater than about 100, or greater than about 150, or greater than about 200, or greater than about 250, or greater than about 300, or greater than about 350, or greater than about 400, or greater than about 450, or greater than about 500. In a preferred embodiment, the repeating unit number n is greater than about 100 as smaller molecular weight leads to better resin flow and dispersion.

In some embodiments, the mass fraction of the fluorinated vinyl polymer resin can be in the range of from about 1% to about 70%, or from about 1% to about 60%, or from about 1% to about 50%, or from about 1% to about 40%, or from about 10% to about 70%, or from about 10% to about 60%, or from about 10% to about 50%, or from about 10% to about 40%, or from about 10% to about 30%, or from about 10% to about 20%, or from about 20% to about 70%, or from about 20% to about 60%, or from about 20% to about 50%, or from about 20% to about 40%, or from about 20% to about 30%, or from about 30% to about 70%, or from about 30% to about 60%, or from about 30% to about 50%, or from about 30% to about 40%. In a preferred embodiment, the mass fraction of the fluorinated vinyl polymer resin can be from about 1% to about 50% for optimal performance.

In some embodiments, the functional polymer of the fluorine-substituted vinyl polymer composition can be selected from the group consisting of epoxy resin, polyphenol ether, cyanate ester resin, polyphenylene ether resin, polybutadiene, polyisoprene, modified epoxy resin, modified polyphenol ether, modified cyanate ester resin, modified polyphenylene ether resin, modified polybutadiene, modified polyisoprene, and mixtures thereof. In a preferred embodiment, the functional polymer is polyphenylene ether resin, through its interaction with fluorine-substituted vinyl polymer resin, is able to improve the electrical and mechanical properties of the fluorine-substituted vinyl polymer resin, as well as enhance processing of the materials. Furthermore, polyphenylene ether resin as the functional polymer can also result in a fluorine-substituted vinyl polymer composition having lower dielectric constant and dielectric loss. In another preferred embodiment, the functional polymer is modified polyphenylene ether resin, which can exhibit properties similar to those of polyphenylene ether resin. Modification of polymers can be carried out by chemical treatment, photo-irradiation, high-energy radiation technique, grafting, among others, as can be appreciated by one of ordinary skill in the art. Modification can lead to improved material properties and characteristics, and may also improve workability in making the fluorine-substituted vinyl polymer composition.

In one embodiment, the fluorinated vinyl polymer composition can further include a filler with a solid mass percentage of less than about 80%, where the filler can be an organic compound or an inorganic compound. In some embodiments, the solid mass percentage of the filler can be less than about 70%, or less than about 60%, or less than about 50%, or less than about 40%, or less than about 30%. In other embodiments, the filler can be optionally surface treated with or without a coupling agent.

In one embodiment, the fluorinated vinyl polymer composition can further include a crosslinking agent. In some embodiments, the crosslinking agent is selected from the group consisting of amines, acid anhydrides, phenols, active esters, peroxides, and mixtures thereof.

In one embodiment, the fluorinated vinyl polymer composition can further include a flame-retardant material. In some embodiments, the composition can further include one or more solvents selected from the group consisting of acetone, butanone, cyclohexanone, N,N-dimethylformamide, N,N-dimethylacetamide, benzene, toluene, xylene, water, and mixtures thereof.

Four examples formed using the compositions disclosed in accordance with the present disclosure and two comparative samples are shown below in Table 1.

TABLE 1

|  | Component 1 (%) | Component 2 (%) | Filler (%)/ Crosslinking Agent (%)/Flame Retardant (%) |
|---|---|---|---|
| Example 1 | Polyvinyl Fluoride (3%) | Polyphenyl Ether (35%) | 32%/20%/10% |
| Example 2 | Polytetrafluoroethylene (20%) | Cyanate Ester Resin (25%) | 25%/18%/12% |
| Example 3 | Polyvinylidene Fluoride (35%) | Polybutadiene (28%) | 12%/15%/10% |
| Example 4 | Polytrifluoroethylene (45%) | Polyphenyl Ether (22%) | 10%/12%/11% |
| Comparative 1 | Polyvinyl Fluoride (45%) | Epoxy Resin (0%) | 20%/20%/15% |
| Comparative 2 | Polyvinyl Fluoride (0%) | Epoxy Resin (50%) | 30%/10%/10% |

In general, each of the four examples includes five components while the two comparative samples include four components. The examples and the comparative samples each includes a filler, a crosslinking agent, and a flame-retardant material, with the examples having two active ingredients and the comparative samples having one active ingredient. The percentages shown in Table 1 are that of the fluorinated vinyl polymer resin compositions proportional to its weight percentages.

As shown in Table 1, the resin composition of Example 1 contains 3% weight percentage of polyvinyl chloride, 35% weight percentage of polyphenol ether, 32% weight percentage of filler, 20% weight percentage of crosslinking agent, and 10% weight percentage of flame-retardant material.

Likewise, the resin composition of Example 3 contains 35% weight percentage of polyvinylidene fluoride, 28% weight percentage of polybutadiene, 12% weight percentage of filler, 15% weight percentage of crosslinking agent, and 10% weight percentage of flame-retardant material.

Furthermore, the resin composition of Comparative 1 contains 45% weight percentage of polyvinyl fluoride, 20% weight percentage of filler, 20% weight percentage of crosslinking agent, and 15% weight percentage of flame-retardant material.

The mechanical and dielectric properties of the four examples and the two comparative samples of Table 1 are shown in Table 2.

TABLE 2

|  | $T_g$ (° C.) | $T_d$ (° C.) | T-288° C. (min) | Peel Strength (lb/inch) | $D_k$ (10 GHz) | $D_f$ (10 GHz) |
|---|---|---|---|---|---|---|
| Example 1 | 175 | 350 | >30 | 6.2 | 2.5 | 0.005 |
| Example 2 | 174 | 361 | >30 | 6.4 | 2.4 | 0.007 |
| Example 3 | 176 | 352 | >30 | 6 | 2.5 | 0.005 |
| Example 4 | 177 | 362 | >30 | 6.5 | 2.5 | 0.004 |
| Comparative 1 | 140 | 340 | 5 | 3 | 2.1 | 0.0005 |
| Comparative 2 | 174 | 360 | >30 | 8 | 3.8 | 0.03 |

As shown in Table 2, the resin composition of Example 1 has a glass transition temperature ($T_g$) of about 175° C., a decomposition temperature (Td) of about 350° C., a delamination time at 288° C. of greater than about 30 minutes, a peel strength of 6.2 lb/inch, a dielectric constant ($D_k$) of 2.5 and a dielectric loss ($D_f$) of 0.005, both at 10 GHz.

Likewise, the resin composition of Example 3 has a glass transition temperature ($T_g$) of about 176° C., a decomposition temperature (Td) of about 352° C., a delamination time at 288° C. of greater than about 30 minutes, a peel strength of 6 lb/inch, a dielectric constant ($D_k$) of 2.5 and a dielectric loss ($D_f$) of 0.005, both at 10 GHz.

Furthermore, the resin composition of Comparative 1 has a glass transition temperature ($T_g$) of about 140° C., a decomposition temperature (Td) of about 340° C., a delamination time at 288° C. of about 5 minutes, a peel strength of 3 lb/inch, a dielectric constant ($D_k$) of 2.1 and a dielectric loss ($D_f$) of 0.0005, both at 10 GHz. This material exhibits good dielectric properties, but has poor heat resistance and mechanical properties.

In some embodiments, the glass transition ($T_g$) of the composition can be greater than about 140° C., or greater than about 150° C., or greater than about 160° C., or greater than about 170° C., or greater than about 171° C., or greater than about 172° C., or greater than about 173° C., or greater than about 174° C., or greater than about 175° C., or greater than about 176° C., or greater than about 177° C.

In some embodiments, the decomposition temperature (Td) of the composition can be greater than about 340° C., or greater than about 350° C., or greater than about 355° C., or greater than about 360° C., or greater than about 361° C., or greater than about 362° C.

In some embodiments, the delamination time of the composition at 288° C. can be greater than about 5 minutes, or greater than about 10 minutes, or greater than about 20 minutes, or greater than about 30 minutes.

In some embodiments, the dielectric constant ($D_k$) of the composition, at 10 GHz, can be in the range of from about 2.4 to about 2.8, or from about 2.4 to about 2.7, or from about 2.4 to about 2.6, or from about 2.4 to about 2.5.

In some embodiments, the dielectric loss ($D_f$) of the composition, at 10 GHz, can be in the range of from about 0.001 to about 0.01, or from about 0.002 to about 0.009, or from about 0.003 to about 0.008, or from about 0.004 to about 0.007, or from about 0.005 to about 0.006.

Example 5

In one embodiment, a prepreg includes a substrate formed by impregnating the substrate with a fluorinated vinyl polymer resin composition having a fluorine-substituted vinyl polymer resin and a functional polymer, and semi-curing or focused curing of the wetted substrate. The fluorine-substituted vinyl polymer resin can have the chemical structure of formula (I) as shown above, where the maximum particle size of the fluorine-substituted vinyl polymer resin within the substrate can be similar to those disclosed above, e.g., the maximum particle size being less than about 100 microns, or less than about 90 microns, or less than about 80 microns, or less than about 70 microns, or less than about 60 microns, or less than about 50 microns.

In some embodiments, each of $R_1$, $R_2$, $R_3$, and $R_4$ of the fluorine-substituted vinyl polymer resin within the substrate can be independently selected similar to those disclosed above, and where at least one of the substituents $R_1$, $R_2$, $R_3$, and $R_4$ includes a fluorine atom. In other embodiments, the fluorine-substituted vinyl polymer resin within the substrate can be similar to those disclosed above, and can be selected from the group consisting of polyvinyl fluoride, polyvinyl fluoride, polyfluoroethylene, tetrafluoroethylene, polytetrafluoroethylene (PTFE), polyvinylidene fluoride, polytrifluoroethylene, and mixtures thereof. In a preferred embodiment, substituents $R_1$ and $R_3$ are hydrogen atoms and substituents $R_2$ and $R_4$ are fluorine atoms rendering polyvinyl fluoride as the preferred fluorine-substituted vinyl polymer. Specifically, polyvinyl fluoride is preferred because its chemical structure is not symmetrical thereby enhancing its polarity thus making it more conducive to resin compatibility and dispersion.

In some embodiments, the repeating unit number n of the fluorine-substituted vinyl polymer resin within the substrate can be greater than about 100, or greater than about 150, or greater than about 200, or greater than about 250, or greater than about 300, or greater than about 350, or greater than about 400, or greater than about 450, or greater than about 500. In a preferred embodiment, the repeating unit number n is greater than about 100 as smaller molecular weight leads to better resin flow and dispersion.

In some embodiments, the substrate of the prepreg can be glass fiber, composite, fiberglass fabric or cloth, or mixtures thereof. In other embodiments, the functional polymer of the fluorinated vinyl polymer composition within the substrate of the prepreg can be selected from the group consisting of epoxy resin, polyphenol ether, cyanate ester resin, polyphenylene ether resin, polybutadiene, polyisoprene, modified epoxy resin, modified polyphenol ether, modified cyanate ester resin, modified polyphenylene ether resin, modified polybutadiene, modified polyisoprene, and mixtures thereof. In a preferred embodiment, the functional polymer is polyphenylene ether resin, through its interaction with fluorine-substituted vinyl polymer resin, is able to improve the electrical and mechanical properties of the fluorine-substituted vinyl polymer resin, as well as enhance processing of the materials. Furthermore, polyphenylene ether resin as the functional polymer can also result in a fluorine-substituted vinyl polymer composition having lower dielectric constant and dielectric loss. In another preferred embodiment, the functional polymer is modified polyphenylene ether resin, which can exhibit properties similar to those of polyphenylene ether resin.

In some embodiments, the dielectric constant of the prepreg, at 10 GHz, can be in the range of from about 2.4 to about 2.8, or from about 2.4 to about 2.7, or from about 2.4 to about 2.6, or from about 2.4 to about 2.5.

Example 6

In one embodiment, a prepreg includes a substrate formed by impregnating the substrate with a fluorinated vinyl polymer resin composition having a fluorine-substituted vinyl polymer resin and a functional polymer, and semi-curing or focused curing of the wetted substrate. The resulting prepreg can be hot pressed to a copper foil to produce a laminate.

In one embodiment, the fluorine-substituted vinyl polymer resin can have the chemical structure of formula (I) as shown above, where the maximum particle size of the fluorine-substituted vinyl polymer resin within the substrate can be similar to those disclosed above, e.g., the maximum particle size being less than about 100 microns, or less than about 90 microns, or less than about 80 microns, or less than about 70 microns, or less than about 60 microns, or less than about 50 microns.

In some embodiments, each of $R_1$, $R_2$, $R_3$, and $R_4$ of the fluorine-substituted vinyl polymer resin within the substrate can be independently selected similar to those disclosed above, and where at least one of the substituents $R_1$, $R_2$, $R_3$, and $R_4$ includes a fluorine atom. In other embodiments, the fluorine-substituted vinyl polymer resin within the substrate can be similar to those disclosed above, and can be selected from the group consisting of polyvinyl fluoride, polyvinyl fluoride, polyfluoroethylene, tetrafluoroethylene, polytetrafluoroethylene (PTFE), polyvinylidene fluoride, polytrifluoroethylene, and mixtures thereof. In a preferred embodiment, substituents $R_1$ and $R_3$ are hydrogen atoms and substituents $R_2$ and $R_4$ are fluorine atoms rendering polyvinyl fluoride as the preferred fluorine-substituted vinyl polymer. Specifically, polyvinyl fluoride is preferred because its chemical structure is not symmetrical thereby enhancing its polarity thus making it more conducive to resin compatibility and dispersion.

In yet another embodiment, a prepreg includes a substrate formed by impregnating the substrate with a fluorine-substituted vinyl polymer resin and a functional polymer, the resin having the chemical structure of formula (I) as shown above.

In some embodiments, the maximum particle size of the fluorine-substituted vinyl polymer resin within the substrate can be similar to those disclosed above, e.g., the maximum particle size being less than about 100 microns, or less than about 90 microns, or less than about 80 microns, or less than about 70 microns, or less than about 60 microns, or less than about 50 microns.

In some embodiments, each of $R_1$, $R_2$, $R_3$, and $R_4$ of the fluorine-substituted vinyl polymer resin within the substrate can be independently selected similar to those disclosed above, and where at least one of the substituents $R_1$, $R_2$, $R_3$, and $R_4$ includes a fluorine atom. In other embodiments, the fluorine-substituted vinyl polymer resin within the substrate can be similar to those disclosed above, and can be selected from the group consisting of polyvinyl fluoride, polyvinyl fluoride, polyfluoroethylene, tetrafluoroethylene, polytetrafluoroethylene (PTFE), polyvinylidene fluoride, polytrifluoroethylene, and mixtures thereof. In a preferred embodiment, substituents $R_1$ and $R_3$ are hydrogen atoms and substituents $R_2$ and $R_4$ are fluorine atoms rendering polyvinyl fluoride as the preferred fluorine-substituted vinyl polymer. Specifically, polyvinyl fluoride is preferred because its chemical structure is not symmetrical thereby enhancing its polarity thus making it more conducive to resin compatibility and dispersion.

In some embodiments, the repeating unit number n of the fluorine-substituted vinyl polymer resin within the substrate can be greater than about 100, or greater than about 150, or greater than about 200, or greater than about 250, or greater than about 300, or greater than about 350, or greater than about 400, or greater than about 450, or greater than about 500. In a preferred embodiment, the repeating unit number n is greater than about 100 as smaller molecular weight leads to better resin flow and dispersion.

In one embodiment, the prepreg having the substrate impregnating with a fluorine-substituted vinyl polymer resin can be further impregnated by semi-curing or partially curing the resin.

In some embodiments, the substrate of the prepreg can be glass fiber, composite, fiberglass fabric or cloth, or mixtures thereof. In other embodiments, the functional polymer of the fluorinated vinyl polymer composition within the substrate of the prepreg can be selected from the group consisting of epoxy resin, polyphenol ether, cyanate ester resin, polyphenylene ether resin, polybutadiene, polyisoprene, modified epoxy resin, modified polyphenol ether, modified cyanate ester resin, modified polyphenylene ether resin, modified polybutadiene, modified polyisoprene, and mixtures thereof. In a preferred embodiment, the functional polymer is polyphenylene ether resin, through its interaction with fluorine-substituted vinyl polymer resin, is able to improve the electrical and mechanical properties of the fluorine-substituted vinyl polymer resin, as well as enhance processing of the materials. Furthermore, polyphenylene ether resin as the functional polymer can also result in a fluorine-substituted vinyl polymer composition having lower dielectric constant and dielectric loss. In another preferred embodiment, the functional polymer is modified polyphenylene ether resin, which can exhibit properties similar to those of polyphenylene ether resin.

In some embodiments, the dielectric constant of the fluorinated vinyl polymer composition within the substrate of the prepreg, at 10 GHz, can be in the range of from about 2.4 to about 2.8, or from about 2.4 to about 2.7, or from about 2.4 to about 2.6, or from about 2.4 to about 2.5.

In one embodiment, a laminate includes hot pressing a copper foil to a prepreg having a substrate formed by impregnating the substrate with a fluorinated vinyl polymer resin composition, where the composition includes a fluorine-substituted vinyl polymer resin and a functional polymer, with the resin having a chemical structure of formula (I) as shown above.

In some embodiments, the maximum particle size of the fluorine-substituted vinyl polymer resin within the laminate can be similar to those disclosed above, e.g., the maximum particle size being less than about 100 microns, or less than about 90 microns, or less than about 80 microns, or less than about 70 microns, or less than about 60 microns, or less than about 50 microns.

In some embodiments, each of $R_1$, $R_2$, $R_3$, and $R_4$ of the fluorine-substituted vinyl polymer resin within the laminate can be independently selected similar to those disclosed above, and where at least one of the substituents $R_1$, $R_2$, $R_3$, and $R_4$ includes a fluorine atom. In other embodiments, the fluorine-substituted vinyl polymer resin within the laminate can be selected similar to those disclosed above, and can be selected from the group consisting of polyvinyl fluoride, polyvinyl fluoride, polyfluoroethylene, tetrafluoroethylene, polytetrafluoroethylene (PTFE), polyvinylidene fluoride, polytrifluoroethylene, and mixtures thereof.

In some embodiments, the repeating unit number n of the fluorine-substituted vinyl polymer resin within the laminate can be greater than about 100, or greater than about 150, or greater than about 200, or greater than about 250, or greater than about 300, or greater than about 350, or greater than about 400, or greater than about 450, or greater than about 500.

In one embodiment, the laminate having the prepreg be further impregnated by semi-curing or partially curing the resin.

In some embodiments, the substrate of the prepreg can be glass fiber, composite, fiberglass fabric or cloth, or mixtures thereof. In other embodiments, the functional polymer of the fluorinated vinyl polymer composition within the laminate can be selected from the group consisting of epoxy resin, polyphenol ether, cyanate ester resin, polyphenylene ether resin, polybutadiene, polyisoprene, modified epoxy resin, modified polyphenol ether, modified cyanate ester resin, modified polyphenylene ether resin, modified polybutadiene, modified polyisoprene, and mixtures thereof.

In some embodiments, the dielectric constant of the fluorinated vinyl polymer resin composition within the substrate, at 10 GHz, can be in the range of from about 2.4 to about 2.8, or from about 2.4 to about 2.7, or from about 2.4 to about 2.6, or from about 2.4 to about 2.5.

The fluorine-substituted vinyl polymer resin composition embodiments disclosed herein are simple to manufacture, and can be applied to various electronic components via prepregs, substrates and laminates incorporating the same. The resulting electronic components are able to demonstrate improved signal transmission speed and reduced signal loss.

The prepreg embodiments disclosed herein can be prepared by impregnating a substrate with the fluorine-substituted vinyl polymer resin composition, without optionally sintering in a mixer cavity or mold pressed, and can be formed in the same way as that of forming a standard FR-4 prepreg. Furthermore, the prepreg embodiments disclosed herein can demonstrate uniform adhesive properties, substantially planar surface, and stable performance. The substrate may be a mixture of glass fibers, glass cloth, or fiberglass cloth, and can incorporate processing steps that are similar to those of standard FR-4 prepreg, thereby delivering prepregs with uniform adhesion properties, surface smoothness, and stable performance.

The prepreg embodiments can be coupled to copper foil to produce a laminated board, where the process of forming the laminated board can be simple and result in laminated materials with excellent mechanical properties, heat resistance and dielectric properties. The laminated boards disclosed herein can meet the characteristics and design requirements of various PCB requirements downstream, and allow for more design freedom with multiple layers of PCB's. By reducing the thickness of the PCB between inner layers and being better able to control the total thickness of the PCB, opportunities exist to create thinner PCB's and PCB's with multiple layers and more complex functionalities. In these instances, the laminated boards having the fluorine-substituted vinyl polymer resin composition can exhibit high glass transition temperature, exceptional peel resistance mechanical properties, and improved dielectric properties. Simply put, the resulting laminated materials are suitable for electronic components used in wireless communication between servers, base stations, antennas and radars, among other telecommunication devices requiring high reliability and materials with low dielectric and signal losses.

Words of comparison, measurement, and timing such as "at the time," "equivalent," "during," "complete," and the like should be understood to mean "substantially at the time," "substantially equivalent," "substantially during," "substantially complete," etc., where "substantially" means that such comparisons, measurements, and timings are practicable to accomplish the implicitly or expressly stated desired result. Words relating to relative position of elements such as "about," "near," "proximate to," and "adjacent to" shall mean sufficiently close to have a material effect upon the respective system element interactions.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A composition comprising:
a fluorine-substituted vinyl polymer resin, a functional polymer, and a crosslinking agent;
wherein
the fluorine-substituted vinyl polymer resin has the chemical structure:

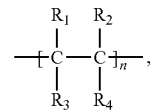

a maximum particle size of the fluorine-substituted vinyl polymer resin is less than 100 microns,
each of the R1, R2, R3, and R4 is a fluorine-containing compound, a hydrogen atom, or a fluorine atom, and at least one of the R1, R2, R3, and R4 includes the fluorine atom, and
n is greater than 100;
wherein
the functional polymer is at least one selected from the group consisting of epoxy resin, polyphenol ether, cyanate ester resin, polyphenylene ether resin, polybutadiene, polyisoprene, modified epoxy resin, modified polyphenol ether, modified cyanate ester resin, modified polyphenylene ether resin, modified polybutadiene, and modified polyisoprene.

2. The composition of claim 1, wherein the crosslinking agent is selected from the group consisting of amines, acid anhydrides, phenols, active esters, peroxides, and mixtures thereof.

* * * * *